United States Patent [19]

Tremblay

[11] Patent Number: 4,924,176
[45] Date of Patent: May 8, 1990

[54] POLARITY INDICATOR FOR VEHICLE BATTERY

[76] Inventor: Alfred U. Tremblay, 2742, Marquette, Longueuil, Quebec, Canada, J4K 4K4

[21] Appl. No.: 313,041

[22] Filed: Feb. 21, 1989

[30] Foreign Application Priority Data

Feb. 22, 1988 [GB] United Kingdom ................. 8804011

[51] Int. Cl.$^5$ ........................................... G01R 19/14
[52] U.S. Cl. .................................... 324/133; 324/426; 320/25; 429/92
[58] Field of Search ................... 320/25, 26; 429/1, 7, 429/92; 324/133, 426

[56] References Cited

U.S. PATENT DOCUMENTS

| 964,994 | 7/1910 | Marko | 429/92 |
| 964,995 | 7/1910 | Marko | 429/92 |
| 1,010,377 | 11/1911 | Kempf | 429/92 |

FOREIGN PATENT DOCUMENTS 0163822 12/1985 European Pat. Off. .............. 429/92

Primary Examiner—Reinhard J. Eisenzopf
Assistant Examiner—Jose M. Solis
Attorney, Agent, or Firm—Roland L. Morneau

[57] ABSTRACT

A polarity indicator adapted to be mounted on a vehicle battery. A light emitting diode mounted on an elongated non-conductive strip and electrically connected to two poles having conductive surfaces at each end of the strip. The poles are intended to be oriented to correspond to the polarity of the battery terminals. When the battery is depleted and needs to be boosted, the booster cables are first connected to the poles which can identify the direction of the flow of current coming from the booster cables, the later being subsequently switch to the proper terminals of the battery.

11 Claims, 1 Drawing Sheet

POLARITY INDICATOR FOR VEHICLE BATTERY

BACKGROUND OF THE INVENTION

1. Field of the Invention

The present invention relates to polarity indicators and more specifically to a polarity indicator located on a battery and which upon contact of connecting means of an external direct current (D.C.) supply gives out a visual signal as to the polarity of the connecting means relative to the polarity of the battery.

Modern automobiles, vehicles and many stationary power sources commonly utilize a D.C. electrical system to start the respective engines and to operate associated equipments. These electrical systems generally rely upon and utilize storage batteries to supply the necessary electric current.

Although such systems are generally reliable, it is often necessary or desirable to supply electrical current to the system from an external source to supplement the output of the storage battery, such as when the storage battery is in a discharged or dead condition. For example, when storage batteries fail to start a vehicle, it is common practice to use jumper cables extending from the battery terminals of an able vehicle to the battery terminals of a disabled vehicle to temporarily aid in starting the disabled vehicle. Such jumber cables have spring clamps commonly known as alligator clips adapted to grip battery terminals, at each end of each of a pair of electrical conductors that have an insulation jacket.

The use of jumper cables is a recognized hazard. The greatest danger involves the incorrect connection of the positive and negative terminals of the battery. The depleted battery and the electrical supply must indeed be connected with their polarities matched or in other words, they must be connected so that the positive terminal of the battery of the able vehicle is connected with the positive terminal of the disabled vehicle's battery and similarly for the negative terminals. If the polarities are mismatched, the result will be arcing, extremely large current flow, dangerous overheating of the cables and battery, splashing of acid from the battery and possible damage to the battery and supply. Damage to the electrical apparatus of the vehicle may also occur.

The potential danger has become particularly important with the advent of alternator systems, transistor radios, voltage regulators and newer ignition systems which can easily be burned out by an improper connection. The alternator tends to be the most susceptible of all the elements of the electrical system to the improper connection and contains diodes that fail very rapidly at currents above rated values.

Another danger involves battery explosion due to sparks igniting hydrogen gas.

Indeed, the batteries produce hydrogen when charging and sparks from the nearly jumper to battery connection can set off an explosion.

The batteries sometimes burst from the explosion and spatter battery acid on bystanders.

Although this type of explosion can also occur when the connection is correctly made, it becomes increasingly probable when the polarities are mismatched.

Accordingly, numerous patents disclose devices designed to minimize the risks of inverting the polarity during the connection of booster cables.

Most of these devices such as the one disclose in U.S. Pat. No. 4,217,534 comprise an indicator interposed between a set of jumber cables and providing a visual and/or aural indication of relative battery polarity as well as a safety circuit to prevent electrical connection when the polarities are reversed. Such systems are integrated with the booster cables. Such devices therefore present the disadvantage of being potentially lost or stolen. Furthermore, they are relatively complex and therefore subject to breakdown and relatively expensive to manufacture.

Another type of device includes an arrangement connected to the battery of each car. The arrangement includes a special plug receptacle designed so that the conductor can only be connected thereto in one way. Examples of such devices are disclosed in U.S. Pat. Nos. 3,466,453, 4,079,304, 4,157,492 and 4,759,728.

Since this type of device is usually attached to the vehicle or the battery, they cannot be lost as was the case with the previously mentioned device.

However, they require the use of a special plug and plug receptacle and therefore cannot be used with conventional booster cables.

The present invention is intended to circumvent the above-mentioned disadvantages.

Accordingly, the invention relates to a polarity indicator which can be readily attached to conventional batteries and which will give a visual indication as to the correct orientation of the booster cables prior to the actual connection of the gripping jaws to the terminals of the battery by a mere contact with the poles of the indicator.

The invention also relates to a polarity indicator which will conform to conventional forms of manufacturing, be of simple construction and easy to use as to provide a polarity indicator which will be economically feasable, long lasting and relatively trouble free in operation.

SUMMARY OF THE INVENTION

The invention consists of a polarity indicator for a vehicle battery which is provided with a positive and a negative pole terminal. The indicator also includes a non-conductive elongated strip supporting the poles and adapted to be aligned end to end between the positive and negative of the battery.

A directional light emitting means and preferably a bicolor light emitting diode (LED) is connected between the poles. Each of the colors emitted by the LED corresponds to one of the polarities of a D.C. current. A resistor element is electrically mounted between one of the poles and the LED. The strip, the poles, the LED and the resistor element are mounted on a self-adhesive tape or are glued directly on the battery.

The tape is adapted to be adhesively fixed on the surface of a vehicle battery between the terminals of the battery.

The tape is mounted so that the direction of polarity of the LED corresponds to the polarity of the battery.

In another embodiment of the invention, the indicator is not adhesively mounted on the battery but is rather built into the battery.

SUMMARY OF THE DRAWINGS

The invention, as exemplified by a preferred embodiment, is described with reference to the drawings in which.

DETAILED DESCRIPTION OF THE INVENTION

Figures 1, 3:
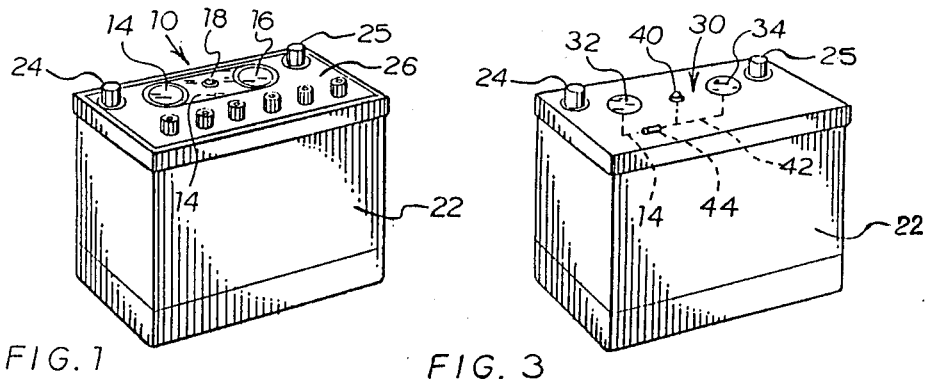
FIG. 1 is a perspective view of an indicator according to the invention mounted on a car battery.
FIG. 3 is a perspective view of a battery with a built-in indicator.
Figure 2:
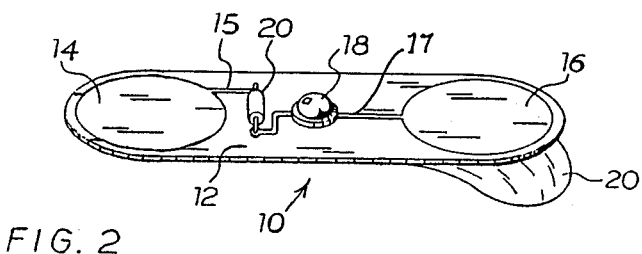
FIG. 2 is a perspective view of one embodiment of the indicator according to the invention.

Referring to the drawings, the polarity indicator 10 comprises a non-conductive elongated strip 12 covered at each end with a conductive metallic surface 14 and 16. A light emitting diode 18 is centrally mounted on the strip 12 between the two electrical surfaces 14 and 16. A resistor 20 is mounted between the surface 14 and the light emitting diode (LED) 18 in order to adjust the electrical characteristics of the vehicle to the electrical characteristics of the light emitting diode 18. The elongated strip 12 is covered underneath with a double sided self-adhesive tape 20 so that the indicator 10 can be fixed on the surface of the battery 22 between the battery terminals 24 and 25. The usual film protector which is fixed on one side of the double sided self-adhesive tape 20 is removed so that the indicator may adhere to the surface 26 of the battery. The elongated strip 12 is oriented so that its longitudinal axis extends between the battery terminals 24 and 25.

As it is well known, the LED's emit a light when a D.C. current flows in one specific direction. Accordingly, if a direct current is applied on the surfaces 14 and 16, the current will flow only if it is oriented in the right direction and if so the light emitting diode will light up. If the strip 12 is oriented in the correct direction, the positive pole 14 will be adjacent the positive battery terminal 24 and accordingly the negative pole 16 will be adjacent the negative terminal 25.

If battery 22 is weak or at least needs to be charged, one end of a pair of cables are connected to a another battery which is fully charged. The other end of the cables are then applied to the poles 14 and 16. If the light emitting diode 18 lights up, it means that the cable can be switched to the corresponding adjacent battery terminals 24 and 25 because the latter are compatibly matched with the terminals of the fully charged battery.

It is preferred to use a light emitting diode 18 of the bi-color type so that one color lights up when the current flow in one direction and a different color lights up when the current flows in the opposite direction. The bi-color LEDS showing red and green colors are generally preferred because these colors are easily associated with danger and action. If the LED lights up green, it means that each of the connecting cables can be connected to the adjacent battery terminals. If the LED lights up red, the cable must be first crossed before they are actually hooked up to the battery terminals. A bi-color LED of the red and green type which may be selected for this invention is made by Leecraft Industries Ltd of Scarborough, Ontario, Canada and is identified by part No L611DRG. Vehicle batteries usually have twelve volts and a resistor 18 having 400 ohms is selected for braker electric results. The conductive surfaces 14 and 16 as well as the printed conductive paths 15 and 17 between the latter and the light emitting diode is made of a copper-base material covered with a lead-base material. This combination of element may be produced as a printed circuit.

The self-adhesive tape 20 is selected for a permanent adhesion to the surface 26 of the battery which is usually made of polyethylene. The tape should also be resistant to oil and grease. For that purpose, tape number 4952 of the 3-M Company as been selected. This tape also contains a thin layer of foam to take up the asperities which may exist on the surface 26 of the battery.

The invention is also be contemplated in the form illustrated in FIG. 3. The two conductive surfaces 32 and 34 are inlaid in the surface 30 of the battery and are connected to the LED 40 by a wiring system 42 and a resistor 44 submerged into the plastic surface 30. In the embodiment illustrated in FIG. 3, the type of LED 40 and of the resistor 44 may be the same as the one described above. The top of surfaces 32 and 34 needs to be exposed on the surface of the battery 22, while the other elements can be at least partly submerged in the top surface of the battery.

Figure 4:
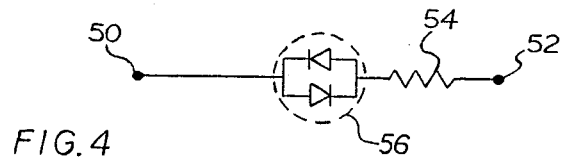
FIG. 4 is an electrical diagram of the invention using a bi-color light emitting diode.

FIG. 4 illustrates a schematic view of the bi-directional LED 56 mounted in series with a resistor 54 between two poles 50 and 52.

Figure 5:
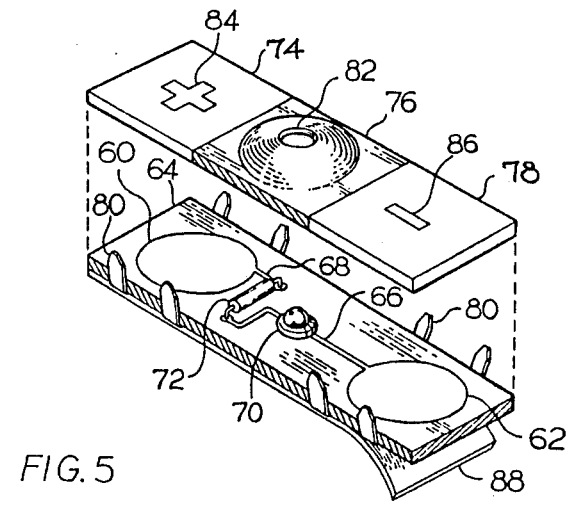
FIG. 5 is an exploded perspective view of another embodiment of the invention.

FIG. 5 illustrates a different embodiment of the invention wherein a copper-base material is deposited into two conductive surfaces 60 and 62 on a non-conductive rigid plate 64 made of a fiberglass. The copper-base material is also printed in the form of the paths 66 and 68 for conducting the current to the LED 70. A resistor 72 is mounted in the conductive path 68. A cover plate made of three sections 74, 76 and 78 is mounted and fixed over the fiberglass plate 64 by gripping teeth 80 adapted to be folded over the cover plate. Sections 74 and 78 are made of metal and comes in contact with the conductive surfaces 60 and 62. Sections 74 and 78 are laterally spaced by a non-conductive intermediate section 76 made of plastic. The section 76 is concave and provided with a central aperture 82 adapted to receive the bulb of the LED 70 and to allow the light to be visible. A plus and minus indicia 84 and 86 are displayed over the sections 74 and 78 respectively. A double sided self-adhesive tape 88 of the type disclosed above is fixed underneath the fiberglass plate 64. Sections 74 and 78 are preferably coated with a composition of tin and lead so as to be more resistant to products such as oil and gas. Although, sections 74 and 78 are illustrated as plates, they may be constituted of a coating of a composition including tin and lead on each side of the plastic plate 76.

Considering that the cables usually used for boosting a battery are provided with jaws having a large nose, the conductive surfaces such as 14 and 16 or the sections 74 and 78 must be at least half an inch in diameter or in diagonal.

The light emitting diode which as been contemplated to be used with a resistor of 400 ohms operates at a voltage at approximately 2.5 volts. If the operating voltage of the LED is different, it is obvious that the type of resistor will change accordingly.

I claim:

1. A polarity indicator for checking the matching of polarities of a vehicle battery with a d.c. power supply, said indicator adapted to be mounted on a vehicle battery provided with a positive and a negative terminal, said indicator comprising a non-conductive elongated strip adapted to be aligned end to end between said positive and negative terminals, a positive and a negative electrically conductive pole spacedly mounted on said strip, said positive and negative poles adapted to be respectfully located adjacent the positive and negative terminals, a directional light emitting means connected between said poles, said light emitting means adapted to emit light upon the passage of an electric direct current between said poles coming from said d.c. power supply, a resistor element electrically mounted between one of said poles and said light emitting means, said strip, said poles, said light emitting means and said resistor element being mounted on a support member adapted to be fixed on the top surface of the vehicle battery between said positive and negative terminals, whereby the light emitted by the light emitting means identifies the matching of the polarity of the d.c. power supply with the polarity of the terminals of battery adjacent the poles of the indicator.

2. A polarity indicator for a vehicle battery as recited in claim 1, wherein the support member is a self-adhesive tape, said tape being adapted to be adhesively fixed on the battery.

3. A polarity indicator for a vehicle battery as recited in claim 1, wherein the light emitting means is a bi-colored light emitting diode (LED), each of said color corresponding to one of the direction of passage of the direct current through the indicator.

4. A polarity indicator for a vehicle battery as recited in claim 1, wherein the light emitting means is a unidirectional LED adapted to light up when the polarity of the indicator corresponds to the polarity of the battery.

5. A polarity indicator for a vehicle battery as recited in claim 1, wherein said poles, said strips and said resistor element are integrated in a printed circuit.

6. A polarity indicator for a vehicle battery as recited in claim 5, wherein the printed circuit is mounted on a double sided adhesive tape.

7. A polarity indicator for a vehicle battery as recited in claim 1, wherein said strips and said resistor element are submerged in the top surface of said battery.

8. A polarity indicator for a vehicle battery as recited in claim 1, wherein the poles and the resistor element are covered with a lead base material.

9. A polarity indicator for a vehicle battery as recited in claim 8, wherein the ends of the poles have a surface of at least half an inch in diameter.

10. A vehicle battery having spaced apart, a positive and a negative terminal projecting from the surface of the battery, and a polarity indicator for checking the matching of polarities of the vehicle battery with a d.c. power supply, said indicator comprising a positive and a negative electrically conducting pole respectively positioned adjacent said positive and negative terminals, a light emitting diode (LED) electrically connected between said poles by a pair of connectors, said diode adapted to emit light upon the passage of an electric direct current between said poles coming from said d.c. power supply, a resistor element mounted in one of said connectors, the connectors, the resistor element, the poles and the LED are at least partly inlaid in the surface of the battery, whereby the light emitted by the light emitting means identifies the matching of the polarity of the d.c. power supply with the polarity of the terminals of battery adjacent the poles of the indicator.

11. A vehicle battery as recited in claim 10, wherein the connectors and resistor element are submerged in the surface of the battery.

* * * * *